United States Patent [19]
Cochran

[11] 4,187,473
[45] Feb. 5, 1980

[54] ELECTRONIC PHASE LOCKED LOOP CIRCUIT

[75] Inventor: Michael J. Cochran, Richardson, Tex.

[73] Assignee: Texas Instruments Incorporated, Dallas, Tex.

[21] Appl. No.: 903,422

[22] Filed: May 8, 1978

Related U.S. Application Data

[62] Division of Ser. No. 791,264, Apr. 27, 1977, Pat. No. 4,126,831.

[51] Int. Cl.² .............................................. H03B 3/04
[52] U.S. Cl. ...................................... 331/8; 307/232; 307/261; 328/151; 331/27
[58] Field of Search ............... 307/232, 262, 228, 353; 331/1 A, 8, 17, 25, 27; 328/151

[56] References Cited
U.S. PATENT DOCUMENTS 4,078,213  3/1978  Campioni .............................. 331/16

OTHER PUBLICATIONS

COS/MOS Phase Comparator, R. Feryszka et al., 1973 IEEE Intern. Solid-State Circuit Confer., pp. 184, 185, 222, 223, Feb. 14–16, 1973.

Primary Examiner—Siegfried H. Grimm
Attorney, Agent, or Firm—William K. McCord; Stephen S. Sadacca; Melvin Sharp

[57] ABSTRACT

An electronic phase locked loop circuit including a variable period sawtooth generator. The sawtooth generator receives digital reference clock signals and in response thereto generates sawtooth-shaped signals having the same period as said reference clock signals. A sample and hold circuit samples the sawtooth-shaped signals in response to one logical state of a sampling clock. A voltage controlled oscillator is coupled to the output of the sample and hold circuit and oscillates at a frequency proportional to the magnitude of the held sample. A feedback circuit generates the sampling clock by coupling the output of the voltage controlled oscillator to the sampling input of the sample and hold circuit.

2 Claims, 22 Drawing Figures

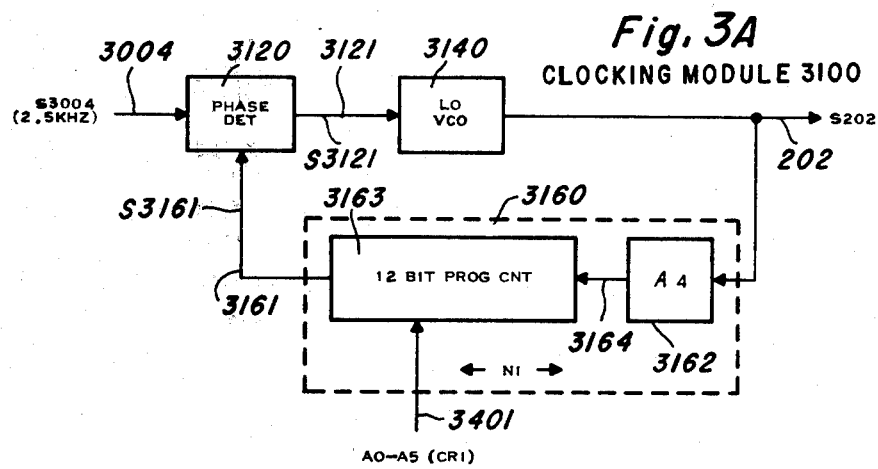
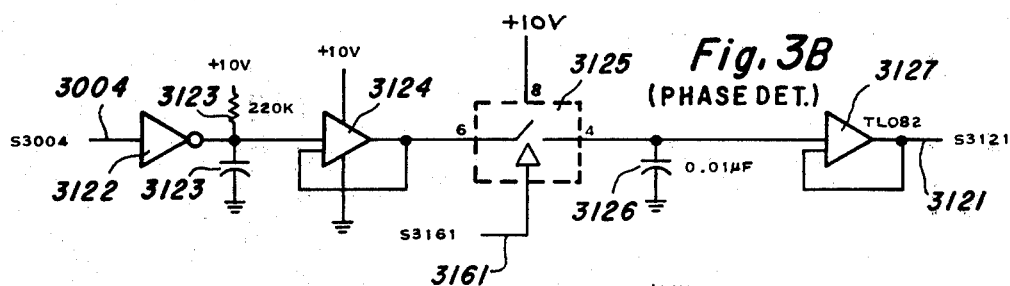
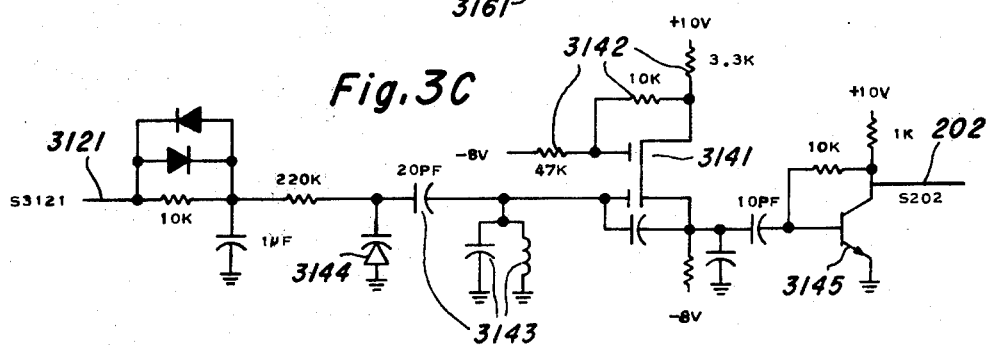

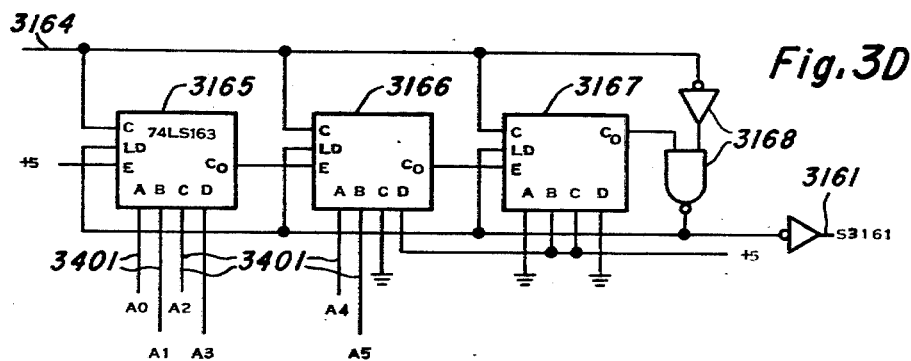
Fig. 3D
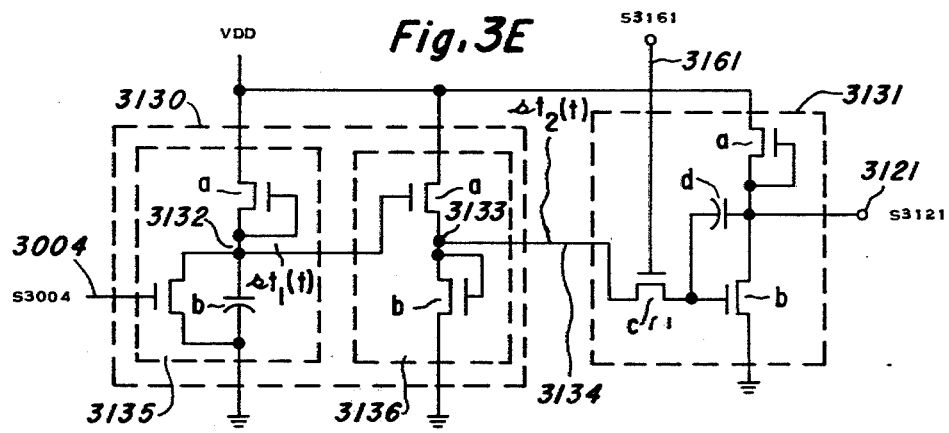
Fig. 3E
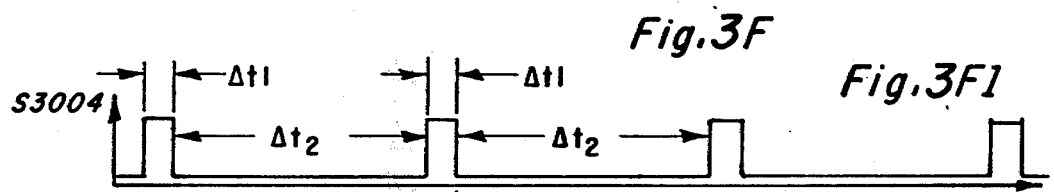
Fig. 3F
Fig. 3F1
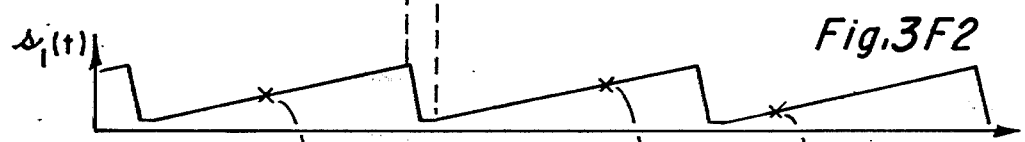
Fig. 3F2
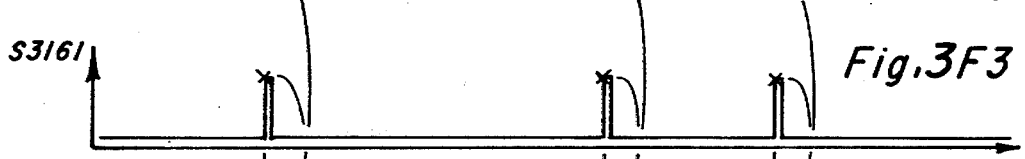
Fig. 3F3
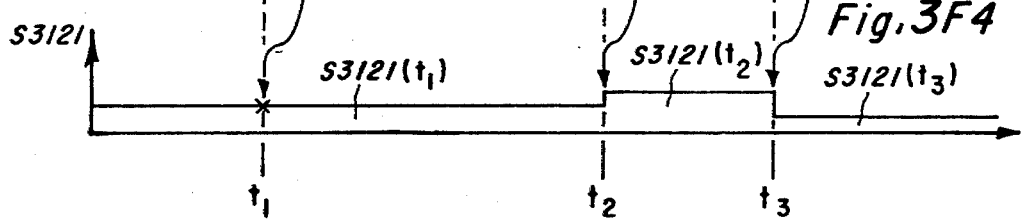
Fig. 3F4

ELECTRONIC PHASE LOCKED LOOP CIRCUIT

This is a division, of application Ser. No. 791,264, filed Apr. 27, 1977, now U.S. Pat. No. 4,126,831.

BACKGROUND OF THE INVENTION

This invention relates to electronic oscillating circuits and, more particularly, to phase locked loops.

This invention further relates to the transceiver and components thereof described and claimed in the following U.S. Patent Applications filed Apr. 27, 1977 and assigned to the assignee of the present invention: U.S. Pat. No. 4,145,655 entitled "A Digitally Transmitting Transceiver" by Edward R. Caudel and William R. Wilson; U.S. Pat. No. 4,132,950 entitled "A Clarifying Radio Receiver" by Michael J. cochran and Edward R. Caudel; U.S. Ser. No. 791,449 entitled "An Automatically Clarifying Radio Receiver" by Michael J. Cochran and Edward R. Caudel; U.S. Ser. No. 791,450 entitled "A Transceiver With Only One Reference Frequency" by Michael J. Cochran; U.S. Pat. No. 4,137,499 entitled "A Signal Strength Measuring Transceiver" by Edward R. Caudel; U.S. Pat. No. 4,153,876 entitled "A Charge Transfer Device Radio System" by Michael J. Cochran; U.S. Pat. No. 4,145,656 entitled "A Transceiver Capable of Sensing A Clear Channel" by Jerry D. Merryman, Michael J. Cochran and Edward R. Caudel; U.S. Pat. No. 4,140,075 entitled "A Highly Selective Programmable Filter Module" by Michael J. Cochran and Edward R. Caudel; and U.S. Pat. No. 4,147,984 entitled "A Dual Processor Transceiver" by Edward R. Caudel, William R. Wilson and Thomas E. Merrow. Such copending patent applications are hereby incorporated herein by reference.

Typically, a phase locked loop includes a phase detecting device, a voltage controlled oscillator (VCO) and a feedback circuit. The phase detecting device receives a reference clock signal and simultaneously receives a feedback clock signal. In response thereto, the phase detecting device generates phase detection signals having an amplitude indicating the difference in phase between its two clock signals. The VCO is coupled to receive the phase detecting signal. In response thereto, the VCO generates VCO output signals having a frequency proportional to the magnitude of the phase detection signal. For example, when the magnitude of the phase detection signal is relatively high, the VCO oscillates at a higher frequency than when the amplitude of the phase detection signal is relatively low. The output of the VCO is coupled to form the feedback clock signal through a feedback circuit. The feedback circuit, typically, either shapes the duty cycle of the VCO output signal or divides the frequency of the VCO output signal by some integer.

Phase locked loops are utilized, for example, to generate a plurality of control signals in synchronism with the reference clock signal. Synchronization between the control clocks and the reference signal is largely dependent upon the operational characteristics of the phase detector. This is because the phase detector controls the VCO which either speeds up in frequency or slows down in frequency in response to the phase detection signals to correct errors indicated by the phase detection signals.

Prior art phase detectors generated the phase detection signal by creating pulse-width modulated signals and sending those signals through a low-pass filter. The width of the pulses of the pulse-width modulated signals were proportional to the difference in phase between the reference clock signal and the feedback clock signal. For example, a relatively small pulsewidth indicated that the oscillator must slow down to get into sync, whereas, a relatively wide pulsewidth indicated that the oscillator must speed up to get into sync. The pulsewidth signals were fed through a low-pass filter to average the width of the pulses thereby generating phase detection signals having an amplitude indicating the phase difference between the reference signal and the feedback signal.

A problem with the above-described prior art is that the resulting phase detection signal doesn't quickly indicate instantaneous changes in phase between the reference clock signal and the feedback clock signal. This is because an inherent time delay is associated with low-pass filters. As a result, the VCO doesn't immediately correct for phase errors, and thus, the errors increase before correction occurs. The delay through a low-pass filter can be lessened by increasing the filter's cut-off frequency, but the result is that the phase detection signal will include a ripple voltage. Thus, the output of the voltage controlled oscillator will follow the ripple voltage and vary in frequency. Additionally, extension of the cut-off frequency of the filter increases the cost of the filter and also makes it too large for integration on a semiconductor chip.

Accordingly, it is one object of the invention to provide a phase locked loop capable of responding quickly to instantaneous frequency changes of a reference signal.

It is still another object of the invention to provide a phase locked loop having a phase detector with no ripple voltage on its phase detection signal.

Another object of the invention is to provide a quickly-responding phase locked loop which is capable of being integrated on a semiconductor chip.

Still another object of the invention is to provide an inexpensive phase locked loop having a fast response time.

SUMMARY OF THE INVENTION

These and other objects are accomplished in accordance with the invention by a phase locked loop comprised of a phase detector, a VCO, and a feedback circuit. The phase detector includes a variable sawtooth generator and a sample-and-hold circuit. The variable sawtooth generator receives digital reference clock signals of a variable frequency and generates, in response thereto, sawtooth-shaped signals. The sawtooth-shaped signals have the same period as the reference clock signals. The sample-and-hold circuit has an input coupled to receive the sawtooth-shaped signals, and has another input coupled to receive a sampling clock signal. The sample-and-hold circuit samples the sawtooth-shaped signals in response to one logical state of the sampling clock signal and generates phase detection signals having a magnitude proportional to the sample. The phase detection signal couples to the input of the VCO. The VCO oscillates at a frequency proportional to the magnitude of a held sample. The VCO output signal is coupled to a feedback circuit for shaping and dividing its frequency to hereby form the sampling clock signal. Utilizing this configuration, the phase locked loop generates no pulse-modulated signals, and thus, eliminates the need for a low-pass filter. Further, the resulting phase detection signal has no ripple voltage, but instead is incremented in steps according to the last sample held. Additionally, the resulting circuit is both inexpensive and capable of integration on a semiconductor chip.

DESCRIPTION OF THE DRAWINGS

The essential features believed to be characteristic of the invention are set forth in the appended claims; the invention itself, however, as well as other features and advantages thereof, may best be understood by referring to the following detailed description of the preferred embodiments when read in reference to the accompanying drawings; wherein:

FIGS. 3A-3F are circuit diagrams of a clocking module 3100 incorporating the present phase locked loop.

DETAILED DESCRIPTION OF SPECIFIC EMBODIMENTS

Figure 1:
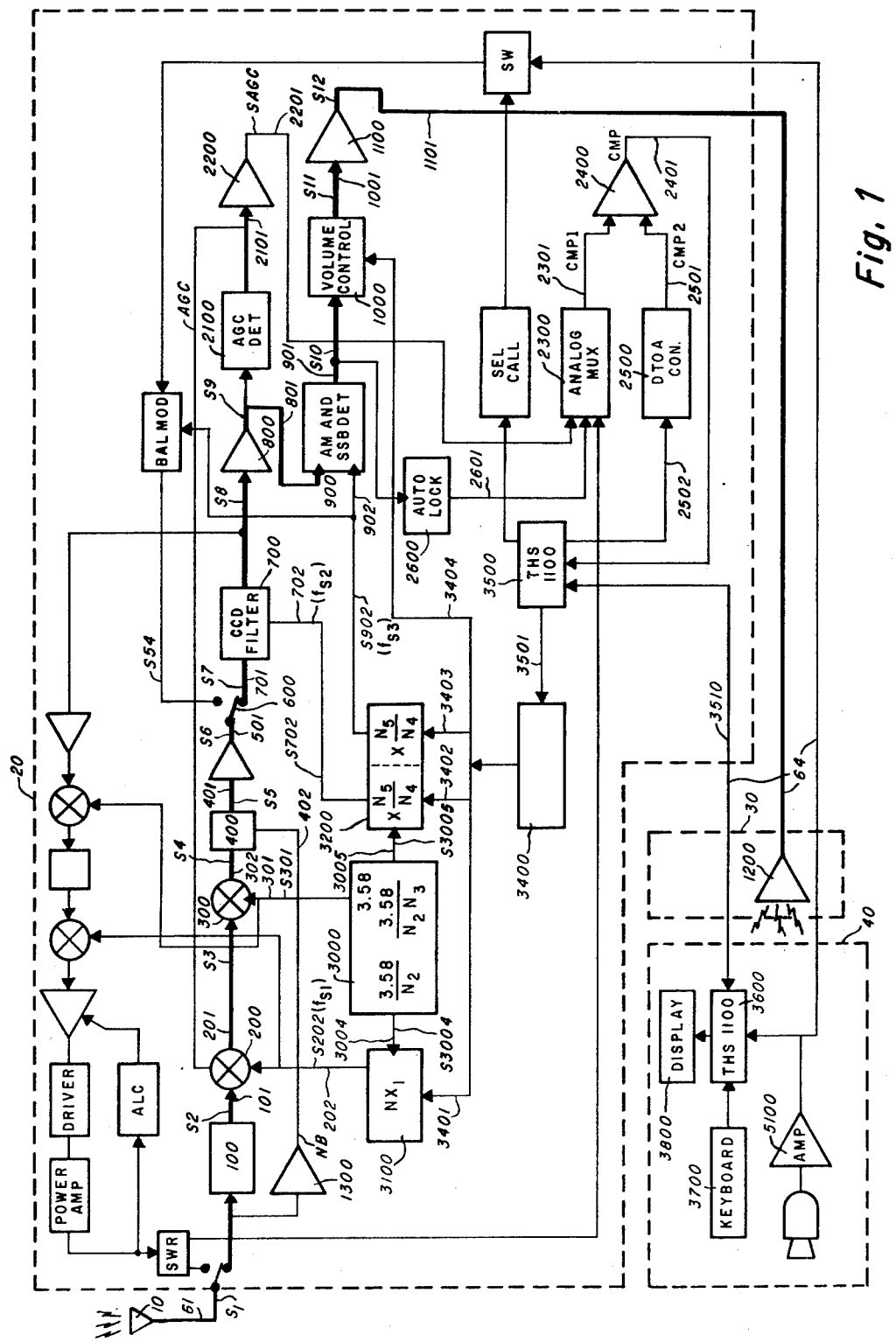
FIG. 1 is a detailed block diagram of a transceiver incorporating a phase locked loop in accordance with the present invention wherein the receive signal path transceiver components are emphasized.

Referring now to FIG. 1, a block diagram illustrating the major components of a transceiver which incorporates a phase locked loop according to the invention is illustrated. The transceiver is comprised of an antenna 10, a signal processing unit 20, a speaker 30, a control unit 40, and a power terminal 50. These components are electrically intercoupled by conductive cables 61–64 as illustrated in FIG. 1.

The transceiver of FIG. 1 has a transmit mode of operation and a receive mode of operation.

In the receive mode, antenna 10 receives radiated electrical signals comprised of a plurality of frequency bands lying respectively within a plurality of non-overlapping frequency channels. The plurality of frequency bands are sent to signal processor 20 via cable 61. Signal processor 20 filters a selectable band from the plurality of bands, and down shifts in frequency the selected band to an audible frequency range. The selected down shifted frequency band is sent to speaker 30 via cable 64 where it is therein converted to audible sounds.

The manner in which the transceiver of FIG. 1 performs the above described receive operation is emphasized in FIG. 1 by a thickened line. Signals S1–S12 are present at various points on this signal path. FIG. 2A–2K is a set of frequency diagrams illustrating some of the signals S1–S12.

Antenna 10 is the first element and signal S1 illustrated in FIG. 2A is generated on lead 61 to filter 100. Signals S2 are generated on lead 101. As illustrated in FIG. 2B, signal S2 has a frequency range approximately between 26.965 MHz and 27.405 MHz. This range of frequencies includes 40 amplitude modulated (AM) channels as presently assigned by the FCC. Each AM channel is divided into a lower sideband channel and an upper sideband channel. FIG. 2B illustrates the 26.965 MHz–27.405 MHz frequency range by the cross hatched area S2a. FIG. 2B1 is a blow up of area S2a and single sideband channels L1, U1, L2, U2, lying within the first two AM channels are illustrated therein.

Lead 101 couples to the signal input of a mixer 200 which has an output lead 201 and signals S3 are generated thereon. Mixer 200 also has an input lead 202 for receiving clock signals of the first selectable frequency $f_{s1}$. The frequency $f_{s1}$ is chosen to equal the difference between the center frequency of the selected AM channel and the quantity 3.125 MHz. Mixer 200 generates signals S3 by mixing signal S2 with frequency $f_{s1}$, and thus the selected AM channel is centered at the frequency 3.125 MHz. This fact is illustrated in FIG. 2c.

Lead 201 couples to a second mixer 300. Mixer 300 has a clock input lead 301 and an output lead 302. A clocking signal of 3.58 MHz is applied to lead 301. Mixer 300 mixes signals S3 with the signal on lead 301 and, in response thereto, generates signals S4 on lead 302. As a result of the mixing operation, the selected AM channel in S4 is centered at frequency 455 kHz. FIG. 2D illustrates signal S4.

Signal S4 passes through a noise blanker 400, and noise blanker 400 is serially coupled to an amplifier 500. Signals S5 and S6 are generated by noise blanker 400 and amplifier 500, respectively. In general, the function of noise blanker 400 and amplifier 500 is to filter and amplify signal S4, but not to frequency shift signal S4. Thus, the center frequency of the selected channel is present in signal S6 at 455 kHz. Signal S6 is illustrated in the frequency domain in FIG. 2E.

In the receive mode, a switch 600 couples signals S6 to the input of a charge transfer device filter 700 via a lead 701. Charge transfer device filter 700 also has a clocking lead 702 for receiving clocking signals of a second selectable frequency $f_{s2}$. In response to the frequency $f_{s2}$, filter 700 generates output signals S8 on a lead 703.

In the preferred embodiment, charge transfer device filter 700 is a charge coupled device (CCD) transversal filter having a plurality of passbands which are programmable by varying the selectable frequency $f_{s2}$. Copending application, Ser. No. 758,366, entitled, "Frequency Converting Filter," by Jerry Norris and Clinton Hartmann, filed January, 1977, assigned to the same assignee of this application, contains a detailed description of its construction. Copending application, Ser. No. 758,365, entitled, "Programmable Frequency Converting Filter," by Lawrence Reagan, filed Jan. 5, 1977, assigned to the same assignee of this application, describes how the passbands of a charge transfer device transversal filter are programmed in response to a clocking frequency. The function of the filter 700 is to receive signals S7 on lead 701, to filter a selected one of the channels (either AM or sideband) from the plurality of channels comprising signal S7, and to frequency shift the selected channel down in frequency.

If the selected channel is a single sideband channel, the channel has a width of approximately 5 kHz and thus filter 700 is clocked with a frequency $f_{s2}$ such that its passbands are approximately 5 kHz wide. In other words, the quantity $1/20 f_{s2}$ approximately equals 5 kHz when the selected channel is a single sideband channel. Additionally, the frequency $f_{s2}$ is chosen such that one of the multiple passbands of filter 700 aligns with the sideband channel to be selected from S7. In the preferred embodiment, the passband of filter 700 that is centered at $5f_{sf} + \frac{1}{4}f_{s2}$ is aligned with the sideband channel selected from signal S7. This is filter 700's eleventh passband. A frequency $f_{s2}$ equal to 86,409 Hz aligns the center of the eleventh passband of filter 700 with frequency 450 kHz. And a clocking frequency $f_{s2}$ of 86,932 Hz aligns the center of the eleventh passband of filter 700 at 460 kHz. The width of both of these passbands is approximately 5 kHz. FIG. 2E1 is a blow up of signal S7 about the frequency of 455 kHz, and FIG. 2F1 is a blow up of FIG. 2F about the same frequency. Together, these figures illustrate the alignment of the eleventh passband of filters 700 with the selected channel.

The clocking frequency $f_{s2}$ is also chosen such that filter 700 has bandwidths of approximately 10 kHz, one of which is centered about the frequency of 455 kHz. Such a characteristic is used to pass an AM signal centered about 455 kHz. A clocking frequency $f_{s2}$ equal to 202,218 Hz causes filter 700 to have its passband centered at 455 kHz and a bandwidth of approximately 10 kHz. This situation is illustrated in FIGS. 2E1 and 2F1.

Lead 703 couples the output of CCD filter 700 to an amplifier 800. Amplifier 800 is tuned to pass only those frequencies lying within the first passband of CCD filter 700. That is, amplifier 800 only passes frequencies lying about $\frac{1}{4} f_{s2}$. Amplifier 800 has an output lead 801 and signals S9 are generated thereon. FIG. 2G illustrates signal S9 on the same frequency scale as FIG. 2F (which illustrates the passbands of filter 700); and FIG. 2H illustrates signal S9 on an expanded frequency scale so that its characteristics are more apparent. In FIG. 2H, the signal S9 is illustrated as lower sideband channel L2 as an example.

Figure 2:
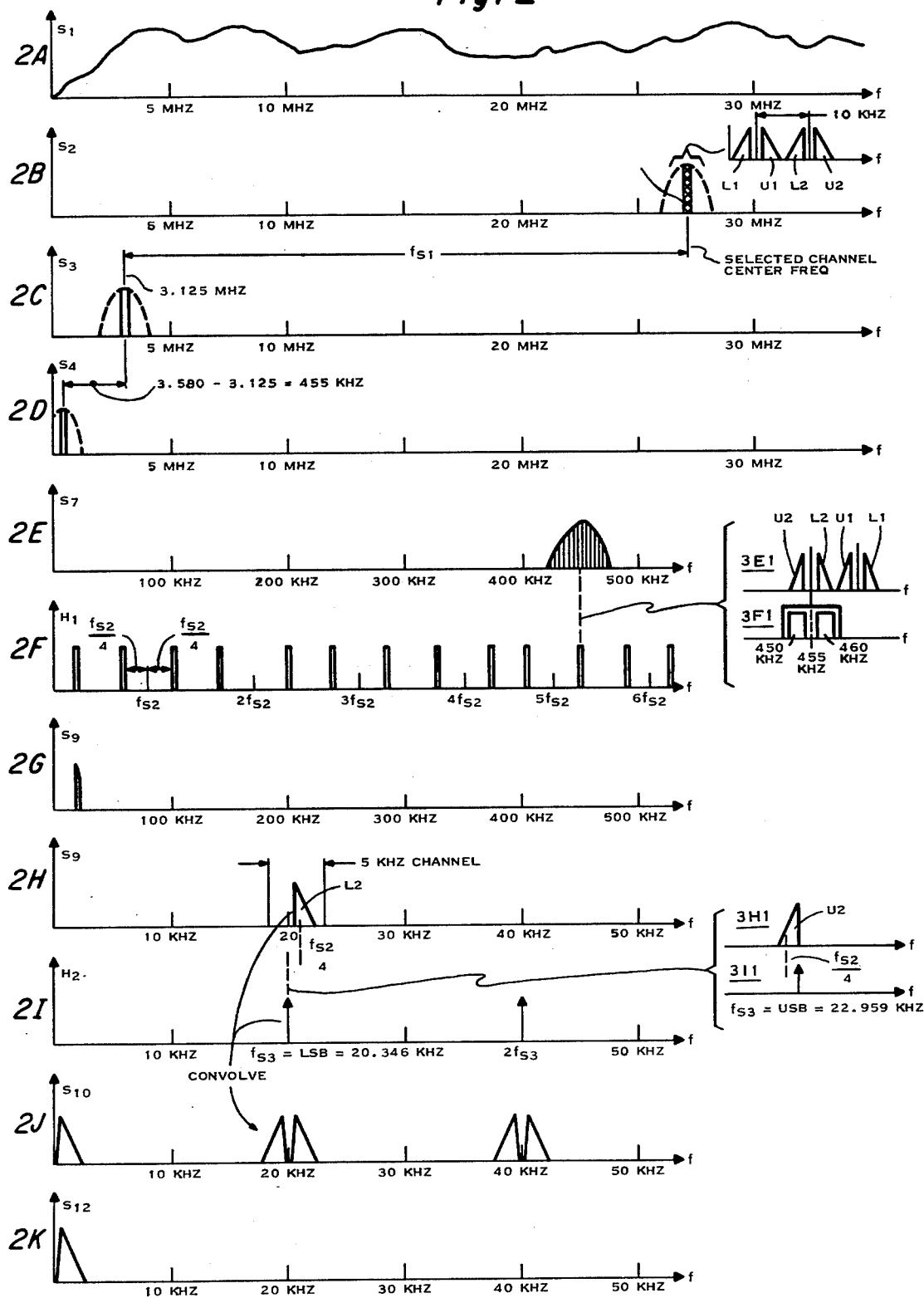
FIG. 2 is a set of frequency diagrams illustrating signals in the frequency domain which are present at various points on the receive signal path of FIG. 1.

Signal S9 is coupled to a demodulator 900 via the lead 801. Demodulator 900 functions to shift signals S9 in frequency to the audio range. When sideband signals are received, this shift in frequency is accomplished by time sampling signal S9 at a third selectable $f_{s3}$. Time sampling equals convolution in the frequency domain. FIG. 2 illustrates the frequency components of a sampling transfer function H2 which samples at a frequency $f_{s3}$ and FIG. 2 illustrates the convolution of signal S9 with transfer function H2. This convolution signal is labeled S10 and is generated on a lead 901.

In order to properly shift signal S9 to the audio frequency range by the convolution operation, it is necessary that the frequency $f_{s3}$ be carefully aligned frequencies of S9. When signal S9 is a lower sideband, frequency $f_{s3}$ is chosen to align with the lowest frequency present. Thus, in FIG. 2, frequency $f_{s3}$ lies to the left of the quantity $f_{s2}/4$, and nominally is 20.346 kHz.

One difficulty in receiving single sideband signals is that they have no carrier to lock onto. Thus, the exact position in frequency of the signal S9 is unknown. All that is known is that the signal lies somewhere within its assigned 5 kHz channel; and therefore a problem exists in being able to align frequency $f_{s3}$ with signal S9 regardless of where the latter lies within its channel. The tone quality of the resulting audible signal is directly related to how well frequency $f_{s3}$ and signal S9 are aligned. Elements 3200-3500 provide a means for incrementally adjusting frequency $f_{s3}$ so as to be properly aligned with signal S9 regardless of where it lies within its 5-kHz channel.

As described above, amplitude modulated signals may also be received. In that case, frequency $f_{s2}$ equals 202,218; and therefore signal S9 which is centered at $f_{s2}/4$ has a center frequency of 50.555 kHz. Demodulator 900 shifts this signal to the audio range by a standard diode envelope detector which does not require a third sampling frequency.

Signal S10 couples via lead 901 to volume control unit 1000. Volume control unit 1000 has an output lead 1001 and signals S11 are generated thereon. Lead 1001 couples to an audio amplifier 1100 which has an output lead 1101 and signals S12 are generated thereon. Lead 1101 coupled to a speaker 30 where the signals S12 shown in FIG. 2K are converted to audible sounds.

As the preceding description indicates, the operation of the transceiver of FIG. 1 is dependent upon the proper generation of three selectable frequencies $f_{s1}$, $f_{s2}$, and $f_{s3}$. The clocking means for generating these frequencies are comprised of clocking modules 3000, 3100, and 3200. Basically, module 3000 generates signal S301 which is comprised of a fixed frequency of 3.58 mHz. Module 3000 also generates signals S3004 and S3005 on leads 3004 and 3005, respectively. Lead 3004 couples to module 3100, which in response to S3004 generates signals S202 comprised of frequency $f_{s1}$. Lead 3005 couples to module 3200 which receives signals S3005 and, in response thereto, generates signals S702 and S902 comprised of frequencies $f_{s2}$ and $f_{s3}$, respectively.

The selectable frequencies $f_{s1}$, $f_{s2}$, $f_{s3}$ are generated as multiples of 3.58 mHz. These multiples are designated as $N_1$–$N_6$ in FIG. 2. Some of the multiples are fixed, while other multiples are programmable.

$N_2$ is chosen so that signal S3004 is a fixed frequency. Accordingly, a selectable frequency $f_{s1}$ is obtained by setting $N_1$.

The multiplier $N_3$ is fixed. Thus, signal S3005 is a fixed frequency. And therefore, selectable frequency $f_{s2}$ is selected by varying 5.

Selectable frequency $f_{s3}$ is generated by appropriately choosing $N_6$. Frequency $f_{s3}$ is suitable for demodulating upper and lower sideband channels depending upon the value of $N_6$.

As the preceding description pointed out, sideband signals may lie anywhere within their assigned 5-kHz channel, and thus it is desirable to control the selectable frequency $f_{s2}$ in fine increments. Signal S3005 has a fixed frequency of 250 hertz and multiplier $N_4$ is fixed at 55. This produces a programmable incremental frequency $f_{s2}$ of approximately 5 Hz.

FIGS. 3A–3E illustrate the circuit details of clocking module 3100. In particular, FIG. 3A is a block diagram illustrating the major components comprising clocking module 3100, while FIGS. 3B–3E are detailed circuit diagrams of the most complex components. As illustrated in FIG. 3A, clocking module 3100 is implemented by means of a phase lock loop. The phase lock loop is comprised of a phase detector 3120, a voltage controlled oscillator (VCO) 3140, and a programmable counter 3160. Phase detector 3120 has a first input coupled to lead 3004 and a second input coupled to an output of programmable counter 3160 via a lead 3161. A lead 3121 couples an output of phase detector 3120 to an input of VCO 3140. Lead 202 couples an output of VCO 3140 to an input of counter 3160 thereby completing the phase locked loop.

Phase detector 3120 is illustrated in detail in FIG. 3B. It includes a logic gate 3122 having an input coupled to lead 3004 and an output coupled to an RC ramp generating circuit 3123. An operational amplifier 3124 is provided to buffer the output of the ramp generating circuit 3123. A logically-controlled switch 3125 has a signal input which couples to an output of operational amplifier 3124, and a logical control input which couples to a lead 3161. An output of switch 3125 couples to a holding capacitor 3126, and to the input of an operational amplifier 3127. Lead 3121 couples to an output of operational amplifier 3127. In this configuration, signal S3004 causes a ramp signal to be generated at the output of operational amplifier 3124, and switch 3125 samples the ramp signal in response to signal S3161. The sample is stored in holding capacitor 3126 and buffered by operational amplifier 3127. Thus, signal S3121 has a magnitude which reflects the phase difference between signals S3004 and S3161.

FIG. 3c is a detailed circuit diagram of VCO 3140. As therein illustrated, the VCO is comprised basically of a dual gate MOS-FET 3141 having one gate coupled to a biasing network 3142, and having a second gate coupled to a tuned circuit 3143. The tuned circuit includes a vari-cap 3144 which has a capacitance proportional to the voltage applied across its terminals. Thus, the resonant frequency of the circuit 3143 is dependent upon the voltage applied across vari-cap 3144. Signal S3121 is coupled to the vari-cap, and therefore, the oscillating frequency of circuit 3143 is responsive to the magnitude of that signal. The source of FET 3141 is coupled to a buffering transistor 3145. Lead 202 couples to the collector of transistor 3145, and signals S202, having the first selectable frequency, are generated thereon.

Counter 3160 is comprised of a fixed divide-by-four counter 3162, and programmable 12-bit counter 3163. Lead 202 couples to the input of divide-by-four counter, and a lead 3164 couples the divide-by-four counter output to the programmable 12-bit counter input. FIG. 3D is a detailed logic diagram of the 12-bit counter 3163. It is basically constructed of three 4-bit counters 3165-3167. Counters 3165-3167 are serially coupled together to form one 12-bit counter. Programmable logic signals A0-A5 are supplied to the least significant six inputs of counter 3163 via lead 3401. Inputs to the most significant six bits of counter 3163 are fixed at either a 1 or a 0 logic level. Utilizing this configuration, counter 3163 has a programmable count defined in binary as 100100XXXXXX. The complement of this count is loaded into counter 3163 when its carryout is true. Logic gates 3168 are coupled to provide the necessary control signals on the LD inputs of counters 3165-3167.

FIG. 3E is a detailed circuit diagram, of an alternative embodiment of phase detector 3120. The phase detector has a reference clock input lead 3004, a sampling clock input lead 3161, and a phase detection output lead 3121. Reference clock signals S3004 are received on input lead 3004, and sampling clock signals S3161 are received on input lead 3161. In response thereto, phase detection signals S3121 are generated on lead 3121. The phase detection signals are analog signals having a magnitude which reflect the difference in phase between the reference clock and sampling clock signal. More specifically, signal S3121 has a quiescent value when the signals S3004 and S3161 are exactly in phase. On the other hand, signal S3121 has a value larger than the quiescent value when signal S3161 lags in phase from signal S3004. Similarly, signal S3121 has a magnitude smaller than the quiescent value when signal S3161 leads in phase with respect to signal S3004.

The phase detector of FIG. 3E is comprised basically of a variable-period sawtooth generator 3130 and a sample-and-hold circuit 3131. Variable-period sawtooth generator 3130 receives the reference clock signals on lead 3004, and in response thereto, generates sawtooth-shaped signals $st_1(t)$ and $st_2(t)$ having the same period as the reference signals. Signal $st_1(t)$ is generated on a node 3132, and is buffered to node 3133 as signal $st_2(t)$. Sample-and-hold circuit 3131 receives signal $st_2(t)$ on lead 3134 and, simultaneously, receives signal S3161 on lead 3161. Signal S3161 has a "sampling state" corresponding to the high voltage level, and a "non-sampling state" corresponding to a low voltage level. When signal S3161 is in the sampling state, sample-and-hold circuit 3131 samples sawtooth signal $st_2(t)$ and generates phase detection signal S3121 on lead 3121 with a magnitude proportional to the magnitude of the sample. Conversely, when signal S3161 is in the non-sampling state, sample-and-hold circuit 3131 does not sample signal $st_2(t)$, but simply holds the preceeding sample, and continues to generate signal S3121 with a magnitude proportional to the last sample taken.

Basically, variable-period sawtooth generator 3130 consists of an RC timing network 3135 coupled to a buffer circuit 3136. R-C timing circuit 3135 consists of a MOS load transistor 3135a coupled in series with a capacitor 3135b. This series connection forms node 3132. The gate of transistor 3135a couples to its drain. Thus, transistor 3135a operates in the depletion mode to provide a high-resistance path through which capacitor 3135b is charged. A MOS switching transistor 3135c is coupled in parallel with capacitor 3135b. The gate of transistor 3135c couples to lead 3004. Thus, transistor 3135c is selectively turned on or off by reference clock signal S3004.

Buffer circuit 3136 is comprised of a MOS load transistor 3136a coupled in series with a source transistor 3136b. This series connection forms node 3133. The gate of transistor 3136b couples to its source; and the gate of transistor 3136a couples by a lead to node 3132. Lead 3134 couples to the serial connection between transistor 3136a and 3136b, and signal $s_2(t)$ is generated thereon.

Sample-and-hold circuit 3131 is composed of a load transistor 3131a serially connected to a source transistor 3131b. The gate of load transistor 3131a couples to its drain. Thus, load transistor 3131a operates in the depletion mode to provide a high-resistance path to transistor 3131b. Lead 13 couples to the serial connection between transistors 3131a and 3131b, and signal S3121 is generated thereon. The gate of transistor 3131b couples to the source of a transistor 3131c. Lead 3134 couples to the drain of transistor 3131c, and lead 3161 carrying signal S3161 couples to the drain of transistor 3131c.

The operation of the structure of FIG. 3E is illustrated by the voltage-timing diagrams of FIG. 3F. In particular, FIG. 3F1 illustrates signal S3004. During a time interval $\Delta t_1$, signal S3004 is at a high voltage state, and transistor 3135c turns on in response thereto. In this time interval, transistor 3135c provides a low impedance path across capacitor 3135b. Consequently, capacitor 3135b quickly discharges to ground forcing signal $S_1(t)$ to near zero voltage, as illustrated in FIG. 3F2.

Conversely, during a time interval $\Delta t_2$, signal S3004 is in a low voltage state. Transistor 3135c turns off in response to this low voltage, and consequently, capacitor 3135b charges in a ramp-type manner through transistor 3135a. Due to this charging action, the voltage across capacitor 3135b continues to rise until reference clock signal S3004 is switched to the high voltage state or until the voltge on node 3132 reaches Vdd. When the former occurs, capacitor 3135b will again discharge. The time intervals $\Delta t_1$ and $\Delta t_2$ are alternately repeated; and thus, signals $s_1(t)$ and signal $s_2(t)$ have a sawtooth-shaped waveform, as illustrated in FIG. 3F2.

The operation of sample-and-hold circuit 3131 is also illustrated in FIG. 3F. In particular, FIG. 3F3 illustrates signal S3161 which has a high voltage state and a low voltage state. Transistor 3131c, of the sample-and-hold circuit, turns off in response to signal S3161 being in a low-voltage state, and turns on in response to signal S3161 being in a high-voltage state. Thus, a high voltage signal 3161 transfers the voltage on lead 3134 to the gate of transistor 3131b. Conversely, a low voltage signal S3161 isolates the gate of transistor 3131b from lead 3134. Since no discharge path is provided for the gate of transistor 3131b, the voltage there remains held in the Miller capacitance 3131d of transistor 3131b until the next sample is taken.

Figure 4:
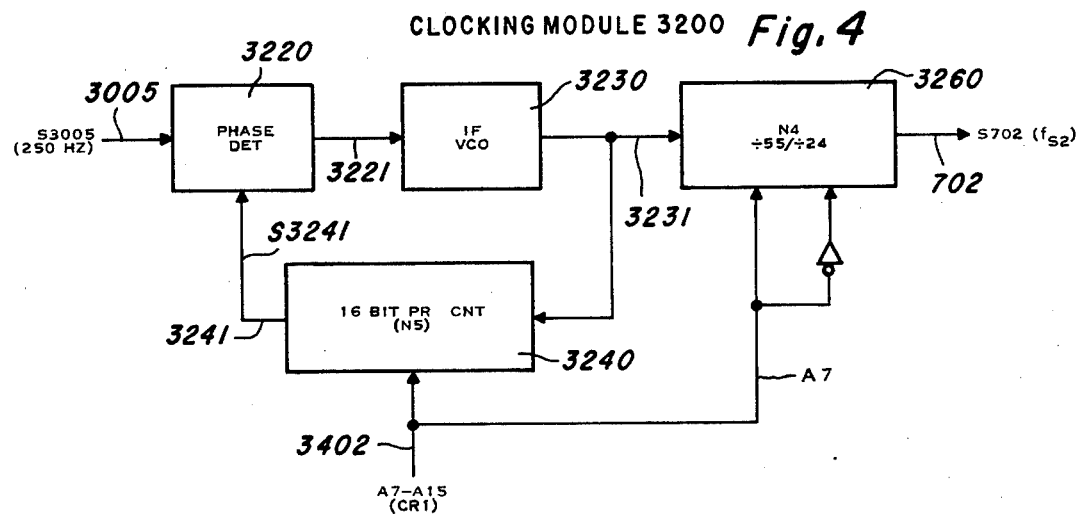
FIGS. 4 is a logic diagram of a clocking module 3200 incorporating the present phase locked loop.

The above-described sample-and-hold operation is illustrated in FIGS. 3F3 and 3F4. As therein illustrated, at a time $t_1$, signal S3161 goes high for a short period of time; and in response thereto, circuit 3131 samples the voltage on lead 3134. The value of this sample, designated S3121($t_1$) is held in capacitor 3131d and reflected on output lead 3121 until the next sample is taken. The sample at time $t_1$ is illustrated in FIG. 3F4 as having occurred in the center of the charging period $\Delta t_2$. The fact that this sample occurs late in the $\Delta t_2$ period is reflected by the amplitude of the sample taken and the signal S3121($t_2$). In particular, the amplitude of this second sample will be greater than the amplitude of the preceeding sample; and the difference is proportional to the amount of phase difference between signals S3004 and S3161 at time $t_2$.

FIG. 3F also illustrates a sample taken at time $t_3$ which occurs earlier than midway through the sampling period $\Delta t_2$. The sawtooth-shaped signal $s_2(t)$ has a relatively small amplitude when this sample is taken. Thus, the output signal S3121($t_3$) has a smaller amplitude than the signal S3121($t_1$). And this difference is proportional to the phase difference between signals S3004 and S3161 at time $t_3$.

Note that the clocking means herein described utilizes only a single reference frequency (single crystal oscillator) from which all of the mixing frequencies and modulating frequencies are derived. This clocking means may also be utilized in transceivers which perform the sideband filtering with crystal filters. Such a crystal is described, for example, in the *Radio Amateur's Handbook* on pages 414–419, published by the American Radio Relay League in 1976. The crystal filter therein described would replace charge coupled device filter 700, and the frequency shifting performed by filter 700 would be performed by altering frequencies $f_{s1}$, $f_{s3}$, or by adding an additional mixer.

A block diagram of clocking module 3200 is illustrated in FIG. 4. As therein illustrated, the N5 factor is implemented by means of a phase lock loop. This loop is similar in structure to the phase lock loop which was utilized to implement the N1 factor as described in FIG. 3A. The phase lock loop in FIG. 4 is comprised of a phase detector 3220, a VCO 3230, and a 16-bit programmable counter 3240. Phase detector 3220 has a first signal input coupled to lead 3005 for receiving signals having reference frequency of 250 Hz, and a second input coupled to lead 3241 for receiving signals generated by counter 3240. The output of phase detector 3220 is coupled via a lead 3221 to an input of VC0 3230. A lead 3231 couples an output of VC0 3230 to an input of counter 3240, thereby completing the loop.

Various embodiments of the invention have now been described in detail. Since it is obvious that many changes and modifications can be made in the above details without departing from the nature and spirit of the invention, it is understood that the invention is not to be limited to said details except as set forth in the appended claims.

What is claimed is:
1. A phase locked loop circuit comprising:
 (a) a sawtooth signal generator means having an input for receiving a reference clock signal, said generator means being responsive to said reference clock signal for generating a sawtooth-shaped signal with the same period as said reference clock signal;
 (b) sample and hold circuit means comprised of:
  (i) a first MOS transistor having source, drain and gate electrodes, the source electrode being coupled to said sawtooth generator means for receiving said sawtooth-shaped signal and the gate electrode being coupled to receive a digital sampling clock signal of selectively controllable clock rate;
  (ii) an MOS load transistor;
  (iii) an MOS source transistor serially coupled to said load transistor, said source transistor having a gate electrode coupled to the drain electrode of said first MOS transistor for receiving samples of said sawtooth-shaped signal and having a Miller capacitance for holding the most current sample of said sawtooth-shaped signal; and
  (iv) output means coupled to said source transistor for generating a phase detection signal of a magnitude proportional to the magnitude of a sample held by said Miller capacitance;
 (c) programmable counter means coupled to receive multibit digital commands from a digital processor means for generating said digital sampling clock signal at a clock rate selected according to said multibit digital commands;
 (d) a voltage-controlled oscillator circuit coupled to the output means of said sample and hold circuit means, said oscillator circuit for generating an output clock signal at a frequency proportional to the magnitude of said phase detection signal; and
 (e) a feedback loop coupling said voltage-controlled oscillator circuit to said programmable counter means for selectively locking the phase locked loop circuit to a frequency selected by said digital processor means.
2. A phase locked loop circuit comprising:
 (a) sawtooth signal generator means including:
  (i) a resistive means,
  (ii) a capacitive means serially coupled to said resistive means, and
  (iii) switching means coupled in parallel with said capacitive means, said switching means having an input coupled to receive a reference clock signal with said switching means being responsive to the voltage levels of said reference clock signal for selectively providing high and low impedance paths in parallel with said capacitive means to generate a sawtooth-shaped signal with the same period as said reference clock signal;
 (b) sample and hold circuit means having a first input coupled to said sawtooth signal generator means for receiving said sawtooth-shaped signals and a second input for receiving a digital sampling clock signal of a selectable clock rate, said circuit means including:
  (i) a first MOS transistor having a source coupled to said sawtooth generator means for receiving said sawtooth-shaped signal and a gate coupled to receive said sampling clock signal;

(ii) a MOS load transistor;
(iii) a MOS source transistor serially coupled to said load transistor, said source transistor having a gate electrode coupled to a drain electrode of said first MOS transistor for receiving samples of said sawtooth-shaped signal and having a Miller capacitance for holding the most current sample of said sawtooth-shaped signal; and
(iv) output means coupled to said source transistor for generating a phase detection signal of a magnitude proportional to the magnitude of a sample held by said Miller capacitance;
(c) a programmable counter means coupled to receive multibit digital commands from a digital processor means for generating said digital sampling clock signal at a clock rate selected according to said multibit digital commands;
(d) a voltage-controlled oscillator circuit coupled to the output means of said sample and hold circuit means, said oscillator circuit for generating an output clock signal at a frequency proportional to the magnitude of said phase detection signal; and
(e) a feedback loop coupling said voltage-controlled oscillator circuit to said programmable counter means for selectively locking the phase locked loop circuit to a frequency selected by said digital processor means.

* * * * *